United States Patent [19]

Ferla et al.

[11] Patent Number: 4,667,393

[45] Date of Patent: May 26, 1987

[54] METHOD FOR THE MANUFACTURE OF SEMICONDUCTOR DEVICES WITH PLANAR JUNCTIONS HAVING A VARIABLE CHARGE CONCENTRATION AND A VERY HIGH BREAKDOWN VOLTAGE

[75] Inventors: Giuseppe Ferla, Catania; Salvatore Musumeci, Riposto, both of Italy

[73] Assignee: SGS Microelettronica S.p.A., Agrate, Italy

[21] Appl. No.: 768,028

[22] Filed: Aug. 21, 1985

[30] Foreign Application Priority Data

Aug. 21, 1984 [IT] Italy .................................. 6616 A/84

[51] Int. Cl.[4] ............................................ H01L 29/78
[52] U.S. Cl. .................................... 29/576 B; 29/571; 148/1.5; 148/187; 148/DIG. 10; 357/20; 357/91; 357/23.8
[58] Field of Search ............... 29/571, 576 B; 148/1.5, 148/187; 357/20, 91

[56] References Cited

U.S. PATENT DOCUMENTS

| | | | |
|---|---|---|---|
| 3,697,829 | 10/1972 | Huth et al. | 148/DIG. 10 |
| 4,099,998 | 7/1978 | Ferro et al. | 148/1.5 |
| 4,172,260 | 10/1979 | Okabe et al. | 357/23 |
| 4,216,029 | 8/1980 | Ohki | 148/1.5 |
| 4,219,829 | 8/1980 | Dorda et al. | 357/23 |
| 4,247,860 | 1/1981 | Tihanyi | 357/23 |
| 4,393,575 | 7/1983 | Dunkley et al. | 29/571 |
| 4,443,931 | 4/1984 | Bauga et al. | 29/571 |
| 4,473,941 | 10/1984 | Turi et al. | 29/578 |
| 4,551,909 | 11/1985 | Cogan et al. | 29/571 |

*Primary Examiner*—Upendra Roy
*Attorney, Agent, or Firm*—Harry M. Weiss & Associate

[57] ABSTRACT

The invention relates to a method for the manufacture of high voltage semiconductor devices with at least one planar junction with a variable charge concentration.

The method consists in doping with impurities of a same type, in a region of monocrystalline semiconductor material, a first zone, and then a second zone which comprises the first, and so on, and in carrying out a subsequent heat treatment so as to provide a planar junction with a stepped profile and a concentration of impurities which decreases from the center to the periphery in a predetemined range. In this way the intensity of the surface electric field, when the junction is reverse biased, is reduced as a result of which it is possible to provide planar junctions having very high breakdown voltages of some thousands of volts.

5 Claims, 2 Drawing Figures

METHOD FOR THE MANUFACTURE OF SEMICONDUCTOR DEVICES WITH PLANAR JUNCTIONS HAVING A VARIABLE CHARGE CONCENTRATION AND A VERY HIGH BREAKDOWN VOLTAGE

BACKGROUND OF THE INVENTION

1. Field of the Invention

The invention relates to electronic semiconductor devices and more precisely to devices comprising at least one planar, P-N junction such as, for example, diodes, bipolar transistors and integrated circuits designed to operate at high voltages, i.e. at voltages of some thousands of volts.

2. Description of the Prior Art

It is known that in order to achieve and maintain high voltages in semiconductor devices with planar, P-N junctions, current technology provides various possibilities. All these have the common objective of providing a junction which comes as close as possible to the ideal case of a junction with plane, parallel surfaces having an infinite extension.

A known device, disclosed in the publication "Solid State Electronics", 1972, Vol. 15, pp. 93–105, involves the use of a metallic field plate which extends over a layer of silicon oxide of constant thickness above the edge of a planar junction. The effect of this structure, when the junction is reverse biased, is to widen the space charge region below the field plate and to increase the radius of curvature of the equipotential lines, thereby causing a reduction of the electrical field and consequently an increase of the breakdown voltage. However, in this case the breakdown voltage is restricted to 600 V as a result of the edge effects which the field plate introduces into the junction.

The above publication also describes a planar junction structure with the metallic field plate disposed on a layer of silicon oxide of variable thickness which enables the above-mentioned voltage limit to be exceeded by modifying the boundary conditions and thereby increasing the breakdown voltage to a value of approximately 1000 V.

A further known possibility is to modify the terminal portion of the junction.

This technique, known by some as "Junction Termination Extension" (JTE) or by others as "Implanted Field Plate" is described, for example, in the publication "IEEE Transactions on Electron Devices", 1983, Vol. ED-30, pp. 954–957. FIGS. 10 and 11 in particular of this publication show a P-N junction terminating with two implanted zones. This structure makes it possible to reach a breakdown voltage of 1400 V, using an N doped substrate with $1.15 \times 10^{14}$ atoms/cm$^3$ in which an impurity of p-type is diffused at a concentration of $10^{17}$ atoms/cm$^3$ and in which two JTE zones with surface concentrations of $3 \times 10^{15}$ and $1 \times 10^{15}$ atoms/cm$^3$ are respectively implanted.

Nowadays, stable, reliable and economically viable electronic semiconductor devices with P-N junctions capable of withstanding voltages of some thousands of volts are required. These devices are required, for example, in the fields of high voltage supply devices, radar, electromedical apparatus using X-rays and, in general, in any field requiring the use of high voltages.

SUMMARY OF THE INVENTION

The object of the present invention is to satisfy this requirement by overcoming and eliminating the limitations and drawbacks of the prior art. These and other objects are achieved by the method of the invention. In summary, this method consists in treating a substrate of monocrystalline semiconductor material having a low concentration of impurities and a predetermined electrical conductivity with the following operations: doping with an impurity of opposite conductivity to that of the substrate of a first zone of the substrate with a first predetermined quantity of impurity, after which this first zone and a second zone which comprises the first zone are doped with a second predetermined quantity of impurity, and then, if necessary, the first, second and a third zone which comprises the first and second zones are doped with a third predetermined quantity of impurity, and so on until the required number of doping operations have been carried out on zones of increasing area, but with a decreasing concentration of impurities.

These doping operations are followed by a heat treatment which causes the diffusion of the impurities in the substrate up to the required depth and enables the achievement of a P-N junction whose stepped profile has a concentration of impurities which decreases from the centre to the periphery for a predetermined extension, as the concentrations of doping agent are added together zone by zone.

An embodiment of the invention is illustrated below by way of nonlimiting example, with reference to the attached drawings in which:

OPERATION OF THE PREFERRED EMBODIMENT

Figure 1:
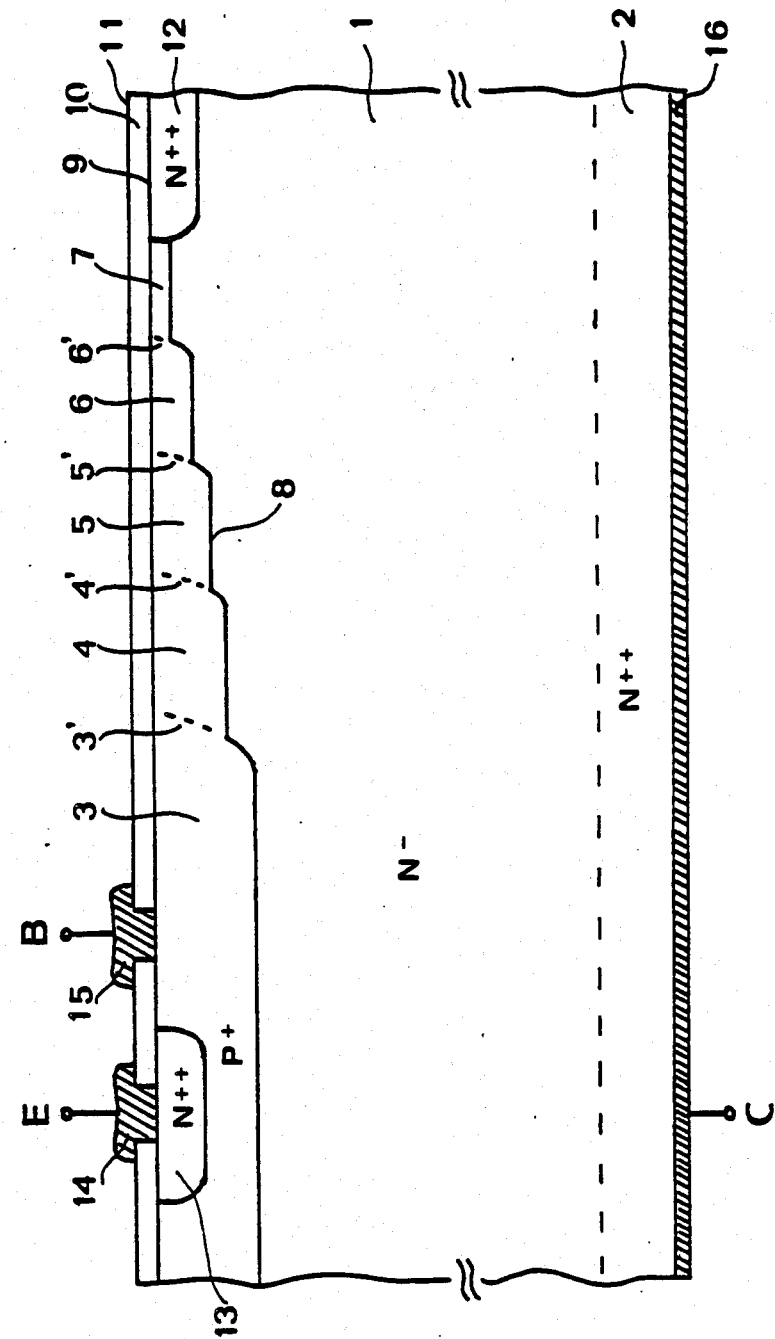
FIG. 1 shows a section, not to scale, of a portion of a silicon chip comprising an n-p-n power transistor having a very high voltage collector-base junction in accordance with the invention.

The device with the very high voltage P-N junction is described with reference to FIG. 1, this device being constructed by means of the following method steps, which are described with reference, for simplicity of explanation, to a chip of a monocrystalline silicon wafer.

STEP 1

Use is made of a substrate 1 of monocrystalline silicon of n-type and a low concentration of doping agent, or with a resistivity value of more than 500 ohm/cm and a thickness of 425 μm.

The surfaces of the substrate are then oxidised.

STEP 2

A face of the substrate of the chip, called the "front" of the chip in the following description, is subjected to an operation, by means of photomasking and etching, to remove the layer of oxide 10 in the area of the surface above the region 3. This surface with the oxide removed and with a width of 3000 μm is then subjected to ion implantation of a p-type doping agent or of a conductivity opposite to the type of conductivity in region 1.

This doping agent is constituted by boron which is implanted at a dosage of $5 \times 10^{14}$ atoms/cm$^2$ with an implantation energy of 100 KeV.

Alternatively, given the high doping level of this reguion, the boron may be deposited by means of a boron nitride BN (A) source of a-type at 950° C. rather than implanted.

STEP 3

The layer 10 of oxide is removed from the surface above the region 4 on the front of the chip by photomasking or etching. Since the surface above region 3 has already had its oxide removed, the entire surface of the continuous zone 3-4, the zone 4 having a width of 180 μm, is free from oxide. The entire surface of this zone 3-4 is then subjected to ion implantation of the same p-type doping agent used for doping the region 3, i.e. boron at a dosage of $1.5 \times 10^{12}$ atoms/cm$^2$ at an implantation energy of 180 KeV.

STEP 4

The steps described above are repeated so as to free the entire surface of the continuous zone 3, 4, 5 (the zone 5 having a width of 180 μm) from oxide and implant the same p-type doping agent already used, i.e. boron, at a dosage of $1.5 \times 10^{12}$ atoms/cm$^2$ at an implantation energy of 180 KeV.

STEP 5

The steps described above are repeated so as to free the entire surface of the continuous zone 3, 4, 5, 6 (the zone 6 having a width of 180 μm) from oxide and implant the same p-type doping agent already used, i.e. boron, at a dosage of $2.5 \times 10^{12}$ atoms/cm$^2$ at an implantation energy of 180 KeV.

STEP 6

The steps described above are finally repeated so as to free the entire surface of the continuous zone 3, 4, 5, 6, 7 (the zone 7 having a width of 90 μm) from oxide and implant the same p-type doping agent already used, i.e. boron, at a dosage of $0.2 \times 10^{12}$ atoms/cm$^2$ at an implantation energy of 180 KeV.

In conclusion, the dosages of boron implanted remain confined in the zones, 3, 4, 5, 6, 7 with together provide the base region of the transistor, and the successive implantations are added in each zone, as shown in the following table:

| ZONE | WIDTH (μm) | IMPLANTATION DOSAGE (atoms/cm$^2$) | CUMULATIVE IMPLANTATION DOSAGE (atoms/cm$^2$) |
|---|---|---|---|
| 3 | 3000 | $5.0 \times 10^{14}$ | $505.7 \times 10^{12}$ |
| 4 | 180 | $1.5 \times 10^{12}$ | $5.7 \times 10^{12}$ |
| 5 | 180 | $1.5 \times 10^{12}$ | $4.2 \times 10^{12}$ |
| 6 | 180 | $2.5 \times 10^{12}$ | $2.7 \times 10^{12}$ |
| 7 | 90 | $0.2 \times 10^{12}$ | $0.2 \times 10^{12}$ |

STEP 7

After the completion of the above-mentioned implantation operations, the p-type doping agent, boron, is diffused at 1200° C. for 8 hours so as to obtain a single base region having, for the purposes of the production method, the course 8 shown in FIG. 1. It should be noted that the depth of this profile 8 within the region 1 below the surface 9 of the oxide layer 10 is of no relevance for the purposes of the invention, whereas the distribution of the quantity of the doping agent within the base region 3, 4, 5, 6, 7 of the transistor is decisive. This has to be understood as the subsequent high temperature operations tend to make the profile 8 of the base region deeper within the collector region 1 of the chip.

STEP 8

The subsequent stages only affect the invention marginally, but are given for reasons of completeness.

The region 2 of low resistivity is then formed by diffusing into the entire surface from the "rear" of the chip, by means of the removal of its covering oxide, the same n-type doping agent, for example phosphorus, already present in the whole of the silicon substrate 1. The collector region of the transistor is thus provided with the required electrical characteristics.

STEP 9

This is followed by the simultaneous formation of the emitter region 13 of the transistor and the region 12 called "channel stopper", whose function is known to perons skilled in the art, by means of the diffusion of an n-type doping agent, for example phosphorus, from the front of the chip into the regions 3 and 1 respectively up to the required depth.

STEP 10

The final step involves the formation of the metallizations 14, 15 and 16, shown in dashed lines in FIG. 1, required respectively for the contacts of the electrodes of the emitter E, the base B and the collector of the transistor.

Although a single embodiment of the present invention has been described and illustrated, it is obvious that many modifications and variants may be made thereto, without departing from the scope of the invention. For example, with reference to FIG. 1, the p-type base region 3, 4, 5, 6, 7 which, together with the n-type collector region 1, of opposite conductivity, forms the very high voltage P-N junction, may be formed by a variable number of cumulatively implanted zones with a minimum of at least one (in this latter case the junction 8 shown in FIG. 1 is modified such that it terminates along the section of curve 4' under the surface 9 covered by the oxide 10).

This number of cumulatively implanted zones $\geq 1$ in the base region of the transistor depends in particular on the maximum voltage which the P-N junction must withstand without breaking. The higher the number of cumulatively implanted zones, the higher the voltage which the junction may withstand. For example, the junction shown in FIG. 1 with 4 cumulatively implanted zones withstands more than 3700 V.

It is also obvious that the method described for the manufacture of an n-p-n transistor may be applied, with the necessary modifications known to persons skilled in the art, to the manufacture of a p-n-p transistor, in which the junction having a very high breakdown voltage is obtained from a p-type substrate in which n-type impurities are implanted and diffused in accordance with the invention.

It is obvious that the horizontal geometry of the P-N junction may be of any shape, as is the case for the interdigitated structures forming the base and emitter regions of a transistor.

Figure 2:
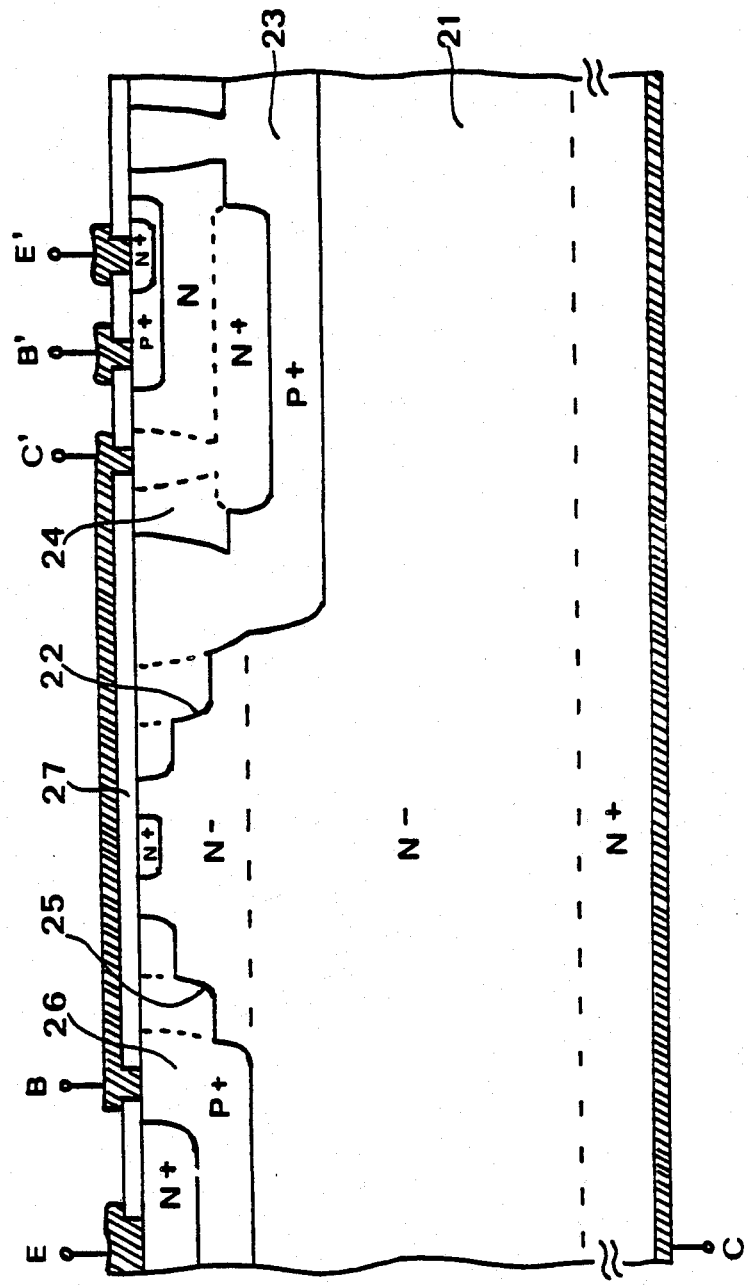
FIG. 2 shows a section, not to scale, of a portion of a silicon chip comprising a monolithic device formed by a bipolar power transistor and by an integrated circuit, both integrated on the same chip.

The invention does not only apply to single or discrete devices such as diodes, bipolar transistors, MOS transistors, but to all semiconductor devices where it is necessary to provide at least one very high voltage P-N junction. For example, FIG. 2 shows a section, not to scale, of a portion of a silicon chip comprising a monolithic device formed on this chip by a bipolar power transistor, shown on the left-hand side of the Figure and by an integrated circuit, of which a single transistor is shown in the right-hand part of the Figure, these being connected together electrically by metallized tracks lying on the oxide layer 27. Two P-N junctions formed in accordance with the invention are shown; the first junction 25 forming the collector-base junction of the power transistor and the second junction 22 forming the junction of the isolation region 23 which surrounds the integrated circuit.

The high voltage junction 22 in the structure of the device shown in FIG. 2 is designed to cause the isolation region 23 to withstand the same voltage supplied to the high voltage collector-base junction 25 of the power transistor. It should be noted that this junction 22 is only present from the high voltage portion of the region 21, forming the collector region of the power transistor of the monolithic device, and not from the low voltage portion of the region 24 forming the collector region of the transistor of the integrated circuit. After having diffused and thus obtained the horizontal isolation layer 23, and after forming the buried layers in the integrated circuit and causing an epitaxial growth of n-doped monocrystalline silicon over the entire surface of the substrate 21, ion implantation is carried out followed by the diffusion of the p-type doping agents so as to form simultaneously both the high voltage P-N junctions 22 and 25 in accordance with the method steps of the invention described above. However, in contrast to the transistor of FIG. 1, in which the junction 8 is formed by 4 cumulative zones, in the device of FIG. 2 both the junctions 22 and 25 have two cumulative zones able to withstand a voltage of at least 1000 V.

In conclusion, the invention may also be applied to bipolar and unipolar devices of lateral type in which the flow of the charge carriers takes place in a horizontal direction.

For example, a high voltage lateral MOS transistor is formed with its drain region having a concentration of impurities which decreases from the centre to the periphery in a stepped profile.

While the invention has been particularly shown and described with reference to preferred embodiments thereof, it will be understood by those skilled in the art that the foregoing and other changes in form and details may be made therein without departing from the spirit and scope of this invention, as described in the following claims.

What is claimed is:

1. A method for the fabrication of a high-voltage semiconductor device comprising the steps of:
    providing a high resistivity semiconductor substrate of a first conductivity type and having a first major surface;
    forming a masking layer over said first major surface;
    forming a first aperture in said masking layer by removing a first portion of said masking layer from said first major surface;
    introducing a first concentration of doping impurities of a second conductivity type opposite said first conductivity type into said substrate through said first aperture to form a first doped region of said second conductivity type in said substrate;
    forming a second aperture in said masking layer by removing a second portion of said masking layer in a region surrounding said first aperture; and
    introducing a second concentration of doping impurities of said second conductivity type into said second aperture and into said substrate including all of said first doped region at said major surface to form a second doped region of said second conductivity type;
    said second concentration of doping impurities of said second conductivity type being less than said first concentration of doping impurities of said second conductivity type.

2. The method according to claim 1 further including the step of providing a first doped region of said first conductivity type in said first major surface, said first doped region of said first conductivity type surrounding but spaced apart from said first doped region of said second conductivity type.

3. The method according to claim 2 wherein said first doped region of said first conductivity type and said second region of said second conductivity type intersect at said first major surface.

4. The method according to any one of claims 1, 2 or 3, wherein the doping concentration in said first doped region of said second conductivity type is substantially equal to said first concentration of doping impurities of said second conductivity type plus said second concentration of doping impurities of said second conductivity type.

5. The method according to any one of claims 1, 2 or 3, wherein said first doped region of said second conductivity type has a greater depth in said substrate than does said second doped region of said second conductivity type.

* * * * *